United States Patent [19]
Lee et al.

[11] Patent Number: 5,985,709
[45] Date of Patent: Nov. 16, 1999

[54] PROCESS FOR FABRICATING A TRIPLE-WELL STRUCTURE FOR SEMICONDUCTOR INTEGRATED CIRCUIT DEVICES

[75] Inventors: Chung-Yuan Lee, Tao Yuan; Chun-Yen Chang, Hsinchu; Sun-Chieh Chien, Hsinchu; Chen-Chiu Hsu, Hsinchu, all of Taiwan

[73] Assignee: United Microelectronics Corp., Hsinchu, Taiwan

[21] Appl. No.: 08/962,116

[22] Filed: Oct. 31, 1997

Related U.S. Application Data

[62] Division of application No. 08/633,020, Apr. 16, 1996, abandoned.

[51] Int. Cl.$^6$ .................................................. H01L 29/68
[52] U.S. Cl. ........................... 438/228; 257/371; 257/296
[58] Field of Search ............................. 438/228; 257/371, 257/296; 365/182, 226

[56] References Cited

U.S. PATENT DOCUMENTS

| | | | |
|---|---|---|---|
| 5,293,055 | 3/1994 | Hara et al. ............................... | 257/371 |
| 5,373,476 | 12/1994 | Jeon ........................................ | 257/371 |
| 5,519,243 | 5/1996 | Kikuda et al. ........................... | 257/371 |
| 5,604,697 | 2/1997 | Takahashi et al. ...................... | 365/182 |

FOREIGN PATENT DOCUMENTS

| | | | |
|---|---|---|---|
| 230828 | 9/1994 | Taiwan ...................................... | 27/92 |

OTHER PUBLICATIONS

Stanley Wolf Silicon Processing for the VSLI ERA vol. 2 Lattice Press pp. 390–391, 1990.

*Primary Examiner*—Charles Bowers
*Assistant Examiner*—David S Blum
*Attorney, Agent, or Firm*—Rabin & Champagne, P.C.

[57] ABSTRACT

A triple-well structure for semiconductor IC devices such as an SRAM IC device and a process for its fabrication, that allows for improved data storage stability as well as improved immunity capability against interference from device I/O bouncing and alpha particles. The triple-well structure includes at least one P-well in a P-type substrate, a number of N-wells, and a retrograde P-well formed within one of the N-wells. The process for fabricating the triple-well structure includes first implanting boron ions in the P-type substrate. A photomask is subsequently formed for the implantation of phosphorous ions in the region where a P-type MOS transistor is to be fabricated. A high temperature drive-in procedure is then employed to form a P-well and a number of N-wells. A selected area of one of the N-wells where an N-type MOS transistor is defined is then subjected to boron ion implantation, which is followed by an annealing procedure to form the retrograde P-well.

9 Claims, 2 Drawing Sheets

ND FOR FABRICATING A TRIPLE-
WELL STRUCTURE FOR SEMICONDUCTOR
INTEGRATED CIRCUIT DEVICES

This is a Division of application Ser. No. 08/633,020, filed Apr. 16, 1996, now abandoned.

BACKGROUND OF THE INVENTION

1. Field of the Invention

The invention relates in general to a triple-well structure for semiconductor integrated circuit (IC) devices and a process for its fabrication. In particular, the invention relates to the triple-well structural configuration for semiconductor IC devices formed in a P-type substrate for such devices and its process of fabrication.

2. Related Art

Semiconductor IC's can generally be categorized as either logic devices or memory devices. Logic devices include devices usually utilized to perform logical operations on digital information. For example, microprocessors employed as central processing units (CPUs) for computer systems are such logic devices, which are used to perform fast and complicated logical operations on digital data. On the other hand, memory devices include devices utilized to store digital information in various digital electronic systems. For example, random access memory (RAM) devices in a computer system are employed to temporarily hold data for the operation of the logic devices when required.

As the processing capability of microprocessors is becoming ever more powerful, the complexity and number of digital logic operations are also increasing. This explicitly translates into a need for increased data storage capacity in the memory devices employed in such digital electronics systems.

A significant majority of the semiconductor IC devices in use today are built around complementary metal-oxide semiconductor (CMOS) transistors. As the level of integration for semiconductor IC devices continues to increase, CMOS technology IC devices are becoming more and more popular due to their inherent suitability for high integration IC devices. There are three principle structural designs for CMOS transistors: Two of them are single-well designs that include N- and P-well designs, and a third, which is a double-well design uses twin P-wells.

The physical dimensions of the circuit elements in newly developed semiconductor IC devices are shrinking as such devices are being made with ever higher levels of integration. Once the physical resolution of the design of circuit elements is reduced to below about one micrometer (sub-micron), the electric field intensity in the channel region of a transistor increases due to the fact that the dimensions of that region have been reduced. The electric field intensity in the transistor channel region increases to a level where the operating characteristics of both N- and P-type MOS transistors become more and more similar. The design rules for state-of-the-art sub-micron semiconductor IC devices therefore regards complementary MOS transistors as the appropriate selection as components for the IC circuitry to be designed and fabricated.

Among the categories of memory devices, static random access memory (SRAM) is one of the fastest devices. Due to its necessarily fast access time cycles, SRAM is employed herein as an example to which the triple-well structural configuration and the process of fabrication of the invention may be applied. For purposes of comparison, an SRAM device having the conventional twin-well structure is examined briefly in FIGS. 1a–1c of the accompanying drawings.

FIGS. 1a–1c are cross-sectional views of a transistor in a conventional SRAM device having a twin-well structure, during respective selected stages of its fabrication. To construct such a twin-well transistor, the conventional process may be described to include the following process steps.

Step 1

Referring to FIG. 1a, an oxide layer 11 and a silicon nitride layer 12 are successively formed over the surface of an N-type silicon substrate 10.

Step 2

A photomask is then formed over the surface to define the active region in the silicon nitride layer 12 for the transistor to be fabricated. After the active region is formed, the photomask is removed.

Step 3

Silicon nitride layer 12 is then utilized as a shielding mask for the implementation of an ion implantation procedure to implant boron ions into the N-type substrate 10. The implantation may be performed at an energy level of about 200 KeV, and achieves an impurity dosage of about $1\times10^{13}$ atoms/cm$^2$.

Step 4

Another photomask is then formed for the purpose of implanting boron or phosphorous ions (not shown in the drawing) in the peripheral circuit regions to surround the P-type MOS transistor being fabricated for the SRAM device. At the conclusion of this ion implantation procedure, the photomask is removed.

Step 5

Referring next to FIG. 1b, a wet oxidation procedure is then employed to grow a field oxide layer 13, and is followed by a high-temperature thermal diffusion procedure that drives into the N-type substrate 10 the ions implanted in the previous Steps 3 and 4 in the N-type substrate 10. This forms a P-well 14 and N-wells not shown in the drawing.

Step 6

Next, the silicon nitride layer 12 is removed from the surface of the substrate.

Step 7

A further photomask is then employed to define the memory cell region for the SRAM device, after which a third ion implantation procedure is implemented. In this implantation procedure boron ions are implanted in the defined memory cell region. The boron implantation allows for threshold voltage adjustment in the memory cell transistor for the SRAM device. The boron implantation may be performed at an energy level of about 60 KeV so as to achieve an impurity dosage of about $3\times10^{12}$ atoms/cm$^2$. After that, the photomask is removed.

Step 8

The oxide layer 11 is then removed as shown in FIG. 1c.

Step 9

A gate oxide layer 17 is next formed over the exposed surface of the N-type substrate 10.

Step 10

A polysilicon gate layer 15 is formed over the surface of the gate oxide layer 17.

Step 11

Boron or phosphorous ions are implanted in the polysilicon gate layer 15 in a further ion implantation procedure.

Step 12

Next, by a high temperature annealing procedure the initial voltage adjustment region 16 is produced beneath the gate oxide layer.

The above generally concludes the process for the fabrication of the twin-well transistor structure for conventional SRAM devices. Conventional SRAM products employ N-type silicon substrate wafers in order to prevent interference otherwise caused by I/O bounces or α particles. The aim is to establish stability of the data held in the memory cell transistors of the SRAM device. These conventional SRAM devices, fabricated over N-substrate wafers, however, have the following disadvantages.

Firstly, because SRAM IC's are becoming more popular for use in many digital electronics systems such as personal computers, a resultant large market demand has caused a supply shortage in the N-type substrate wafers. Secondly, N-type substrate wafers are more difficult and costly to make than the P-type.

SUMMARY OF THE INVENTION

It is therefore the primary object of the invention to provide a triple-well structure for semiconductor IC devices that employs a P-type substrate wafer. The triple-well structure provides improved data storage stability when applied to memory components such as memory cells for memory devices.

To achieve this object, the invention provides a triple-well structure for a semiconductor IC device, that comprises at least one P-well and a number of N-wells formed in a P-type substrate of the device and a retrograde P-well formed in one of the N-wells. In one form of the structure of the invention, the retrograde P-well comprises a memory cell region for an SRAM IC device.

To achieve the above-identified object, the invention further provides a process for fabricating a triple-well structure for a semiconductor IC device. In one embodiment, the process includes the steps of forming at least one P- and a number of N-wells in the P-type substrate and further forming a retrograde P-well in one of the N-wells. In one form of the process, the step of forming at least one P-well comprises an ion implantation procedure, that may include implanting boron ions at an energy level of about 200 KeV, and achieving an implantation dosage of about $1 \times 10^{13}$ atoms/cm$^2$.

In another aspect of the process of the invention, the step of forming a number of N-wells comprises an ion implantation procedure, that may include implanting boron ions at an energy level of about 400 KeV, and achieving an implantation dosage of about $2 \times 10^{13}$ atoms/cm$^2$.

In a further aspect of the process of the invention, the step of forming the retrograde P-well comprises an ion implantation procedure in which boron ions are implanted at an energy level of higher than 200 KeV, and achieves an implantation dosage of greater than $1 \times 10^{13}$ atoms/cm$^2$.

BRIEF DESCRIPTION OF THE DRAWINGS

The invention will be better understood from the following detailed description of the preferred embodiment with reference to the accompanying drawings in which.

DETAILED DESCRIPTION OF THE PREFERRED EMBODIMENT

Figure 1A:
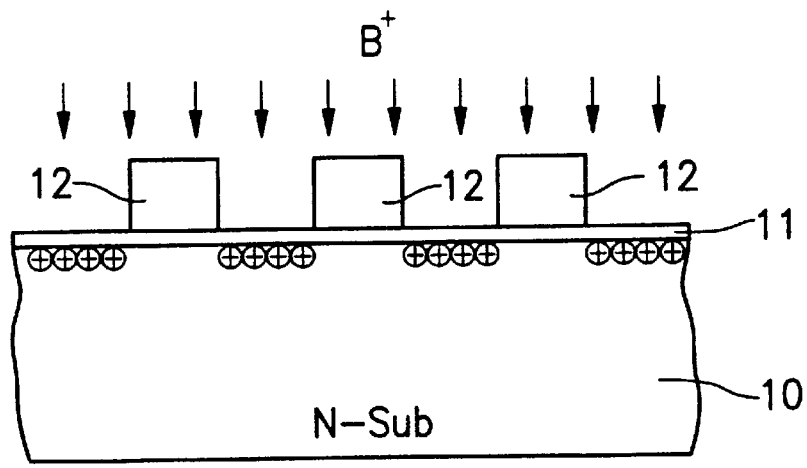
FIGS. 1a–1c respectively show the cross-sectional views of selected stages of fabrication of a transistor in a conventional SRAM device having twin-well structure.
Figure 1B:
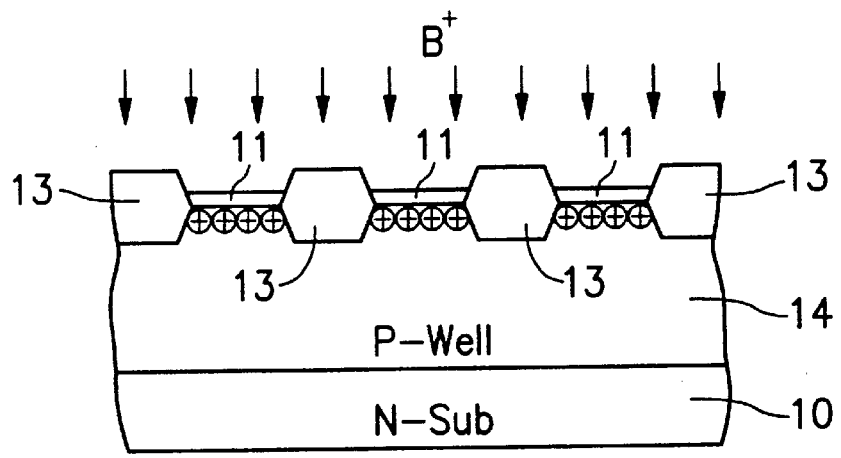
Figure 1C:
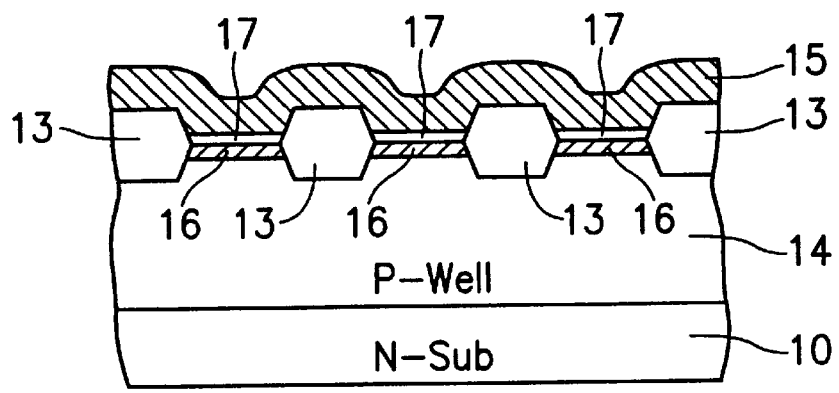
Figure 2A:
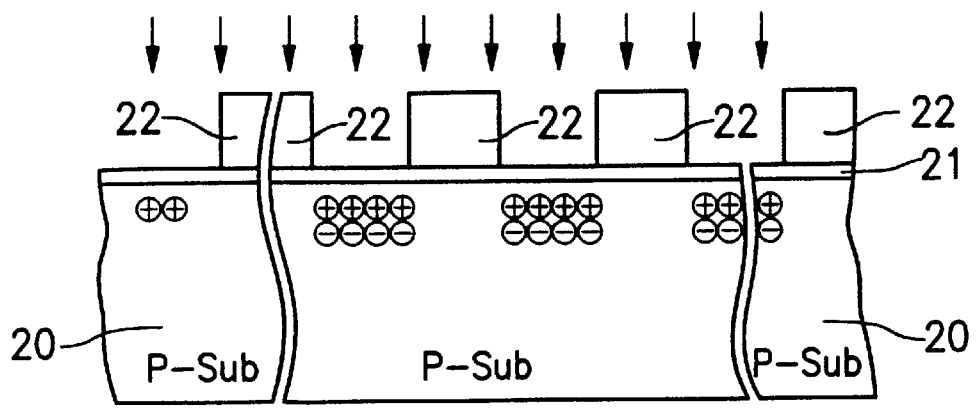
FIGS. 2a–2c respectively show the cross-sectional views of selected stages of fabrication of a transistor in an SRAM device having a triple-well structure, in accordance with a preferred embodiment of the invention.
Figure 2B:
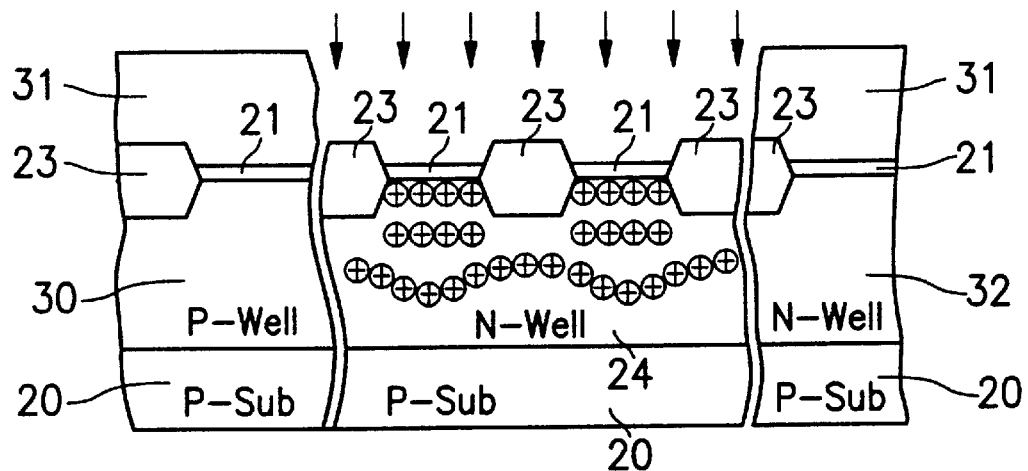
Figure 2C:
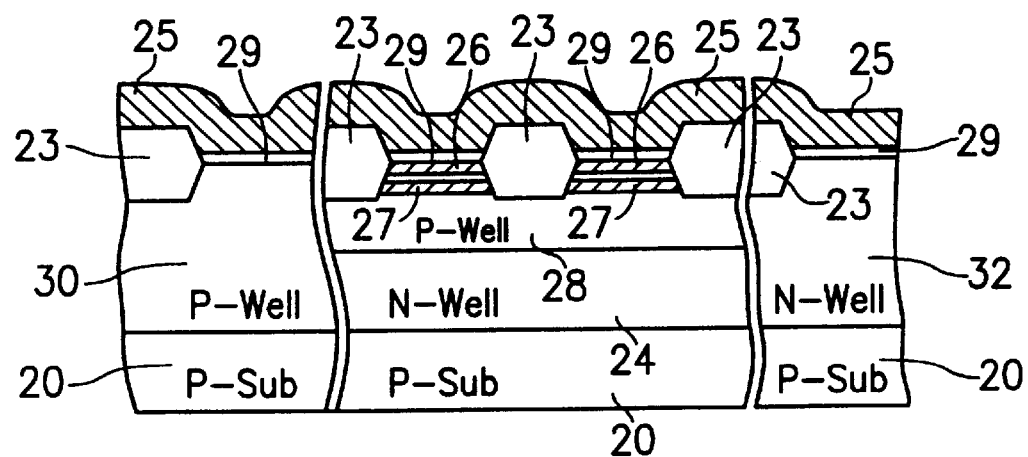

For a description of the triple-well structural configuration of the invention for SRAM IC devices, as well as its process of fabrication, reference is directed to FIGS. 2a to 2c of the drawings. It should be noted that the cross-sectional views are not drawn to exact scale and are intended only for schematic illustration of the characteristics of the invention. A preferred embodiment of the fabrication process includes the following process steps.

Step 1

Referring to FIG. 2a, an oxide layer 21 and a silicon nitride layer 22 are successively formed over the surface of a P-type silicon substrate 10.

Step 2

A photomask is then formed over the surface of the silicon nitride layer 22 to define an active region for the transistor to be fabricated. By use of the mask, portions of the silicon nitride layer 22 are removed to produce a shielding mask that exposes areas for the active regions, and the photomask is then removed.

Step 3

The remaining silicon nitride layer 22, as a shielding mask, is then used during an ion implantation procedure to implant ions into the P-type substrate 20. The implanted material may be boron ions, or any other material having similar characteristics. The implantation may be conducted at an energy level of about 200 KeV, and provide an impurity dosage of about $1 \times 10^{13}$ atoms/cm$^2$.

Step 4

A photomask is then formed for the purpose of implanting ions in the peripheral circuit region surrounding the P-type MOS transistor to be fabricated for the SRAM device. The material used for the implantation may be ions of boron, phosphorous, or any other material having similar characteristics. This ion implantation procedure may be conducted at an energy level of about 400 KeV, and provide an impurity dosage of about $2 \times 10^{13}$ atoms/cm$^2$. After the conclusion of this ion implantation procedure, the photomask is removed.

Step 5

Referring next to FIG. 2b, a wet oxidation procedure is then employed to grow a field oxide layer 23, and is followed by a high-temperature thermal diffusion procedure that drives into the P-type substrate 20 the ions implanted in the previous Steps 3 and 4. This forms an N-well 24 in the memory cell region, and an N-well 32 in the peripheral circuit region surrounding the region to be occupied by the P-type MOS transistor being fabricated, as well as a P-well 30 in another region shown in the cross-sectional view.

Step 6

Then the silicon nitride layer 22 over the surface of the substrate 10 is removed.

Step 7

A photomask layer 31 is next formed for use as a shielding mask to implement a sequence of further boron ion implantation procedures. These ion implantation procedures are each performed at different energy levels and achieve different ion implantation dosages:

1. Boron ions are implanted at an energy level of about 60 KeV and to provide a dosage of about $3 \times 10^{12}$ atoms/cm$^2$ for the purpose of initial voltage adjustment.
2. Boron ions are implanted at an energy level of about 80 KeV to provide an implantation dosage of about $3 \times 10^{12}$ atoms/cm$^2$ for the purpose of anti-punchthrough voltage adjustment.
3. Boron ions are implanted at an energy level of higher than 200 KeV, preferably at 400 KeV, to provide an implantation dosage of greater than $1 \times 10^{13}$ atoms/cm$^2$, preferably about $1.5 \times 10$ atoms/cm $^2$, for the purpose of forming a retrograde P-well.

Step 8

Referring now to FIG. 2c, the photomask layer 31 shown in FIG. 2b is then removed.

Step 9

The oxide layer 21 shown in FIG. 2b is then removed.

Step 10

Next, a gate oxide layer 29 is formed over the exposed surface of the P-type substrate 20.

Step 11

A polysilicon gate layer 25 is formed over the surface of the gate oxide layer 29.

Step 12

Boron or phosphorous ions are implanted in the polysilicon gate layer 25 by an ion implantation procedure.

Step 13

Next, a high temperature annealing procedure is performed so as to simultaneously complete formation of the initial voltage adjustment region 26, the anti-punchthrough voltage adjustment region 27 and the retrograde P-well 28.

This generally concludes the process for the fabrication of the triple-well structural configuration of the invention for SRAM IC devices. The constructed memory device is complete with the N-well 24, P-wells 28 and 30, and N-well 32 forming a triple-well configuration as shown in FIG. 2c. The triple-well structure allows for the establishment of a memory cell transistor in the N-well 24 and the retrograde P-well 28. This configuration makes the SRAM immune to I/O bouncing and a particle interference. Data bits held in this type of triple-well-based memory cells demonstrate improved data stability. Thus, the following summarized advantages are provided by SRAM IC devices having the triple-well structure of the invention:

1. Since the memory cells may be constructed over a P-type semiconductor silicon wafer, the problem of N-type substrate wafer supply shortages is avoided.

2. Since the SRAM memory circuitry may be constructed over the P-type substrate, it is possible to effectively incorporate static memory blocks in logic devices such as microprocessors. This compatibility among the logic and memory devices allows for increased flexibility and functionality for semiconductor IC device design.

3. Since the SRAM memory device may be constructed over a P-type substrate with improved data stability as indicated above, it can therefore be fabricated with finer resolution, which can translate into an increased degree of circuitry integration.

As persons skilled in this art can well appreciate, the above description of the preferred embodiment of the invention is by ways of example only and not by way of limitation. Modifications to the embodiment of the invention will be apparent and should be considered to be within the scope of the invention, which is limited only the following claims.

What is claimed is:

1. A process for fabricating a triple-well structure for a semiconductor integrated circuit device comprising:

a. forming at least one P-well in a P-type substrate;

b. implanting ions into the P-type substrate, then forming a field oxide layer on the substrate, then performing a high-temperature thermal diffusion procedure that drives the implanted ions into the P-type substrate to form a plurality of N-wells in the P-type substrate;

c. performing ion implantation procedures at different energy levels and different ion implantation dosages into one of the plurality of N-wells, including an implantation at a first energy level to provide a first dosage for an initial voltage adjustment region, an implantation at a second energy level to provide a second dosage for an anti-punchthrough voltage adjustment region beneath the initial voltage adjustment region, and implantation at a third energy level to provide a third dosage for a retrograde P-well beneath the anti-punchthrough voltage adjustment region; and d. performing a single high temperature anneal so as to simultaneously complete formation of the initial voltage adjustment region, the anti-punchthrough voltage adjustment region and the retrograde P-well in one of the plurality of N-wells.

2. The process for fabricating a triple-well structure of claim 1, wherein said step of forming at least one P-well comprises a further ion implantation procedure.

3. The process for fabricating a triple-well structure of claim 2, wherein the further ion implantation procedure includes implanting boron ions at an energy level of about 200 KeV, so as to achieve an implantation dosage of about $1 \times 10^{13}$ atoms/cm$^2$.

4. The process for fabricating a triple-well structure of claim 1, wherein the implanting ions includes implanting boron ions at an energy level of about 400 KeV, so as to achieve an implantation dosage of about $2 \times 10^{13}$ atoms/cm$^2$.

5. The process for fabricating a triple-well structure of claim 1, wherein the ion implantation at the third energy level to provide the third dosage for the retrograde P-well includes implanting boron ions at an energy level of about 200 KeV, so as to achieve an implantation dosage of about $1 \times 10^{13}$ atoms/cm$^2$.

6. The process for fabricating a triple-well structure of claim 1, wherein the retrograde P-well comprises a memory cell region for a static random access memory integrated circuit device.

7. The process of claim 1 wherein said step b further comprises producing a shielding mask that exposes areas for the active regions and using the shielding mask during said ion implantation procedures, and performing a wet oxidation procedure to grow the field oxide layer through openings in the mask.

8. The process of claim 1 wherein said step c includes forming a gate oxide layer over exposed surfaces of the substrate between openings in the field oxide layer, forming a polysilicon gate layer over the gate oxide layer and performing said implantation at a first energy level in the polysilicon gate layer.

9. A process for fabricating a triple-well structure for a semiconductor integrated circuit device comprising:

a. successively forming an oxide layer and a silicon nitride layer over a surface of a P-type silicon substrate;

b. forming a first photomask over a surface of the silicon nitride layer to define an active region for a P-type MOS transistor to be fabricated, and using the first mask to remove portions of the silicon nitride layer to produce a shielding mask that exposes areas for active regions, and removing the first photomask;

c. implanting boron ions into the P-type substrate at an energy level of about 200 KeV, so as to provide an impurity dosage of about $1 \times 10^{13}$ atoms/cm$^2$, while using the remaining silicon nitride layer as a shielding mask;

d. forming a second photomask, implanting ions selected from among boron and phosphorous in a peripheral circuit region surrounding the P-type MOS transistor to be fabricated, at an energy level of about 400 KeV, so as to provide an impurity dosage of about $2 \times 10^{13}$ atoms/cm², using the second photomask, and then removing the second photomask;

e. growing a field oxide layer by a wet oxidation procedure and then performing a high-temperature thermal diffusion procedure to drive into the P-type substrate the ions implanted in said steps c and d, to form a first N-well in a memory cell region, a second N-well in the peripheral circuit region surrounding the region to be occupied by the P-type MOS transistor being fabricated, and a P-well in another region;

f. then removing the silicon nitride layer over the surface of the substrate;

g. forming a third photomask, and then performing a sequence of further boron ion implantation procedures using the third photomask as a shielding mask, at different energy levels to achieve different ion implantation dosages, including:
  (1). implanting boron ions at an energy level of about 60 KeV so as to provide a dosage of about $3 \times 10^{12}$ atoms/cm² for an initial voltage adjustment region,
  (2) implanting boron ions at an energy level of about 80 KeV so as to provide a dosage of about $3 \times 10^{12}$ atoms/cm² for an anti-punchthrough voltage adjustment region, and
  (3) implanting boron ions at an energy level of higher than 200 KeV, so as to provide a dosage greater than $1 \times 10^{13}$ atoms/cm² for a retrograde P-well;

h. removing the third photomask after said sequence of further boron ion implantation procedures;

i. then removing the oxide layer to expose the substrate;

j. then forming a gate oxide layer over the exposed substrate surface;

k. forming a polysilicon gate layer over the gate oxide layer;

l. implanting boron or phosphorous ions in the polysilicon gate layer; and m. performing a high temperature anneal so as to simultaneously complete formation of the initial voltage adjustment region, the anti-punchthrough voltage adjustment region and the retrograde P-well.

* * * * *